(12) United States Patent
Walaszek (10) Patent No.: US 10,693,428 B2
(45) Date of Patent: Jun. 23, 2020

(54) SYSTEM AND METHOD FOR CONTROL OF AN ANALOG DEVICE

(71) Applicant: Marek Walaszek, Warsaw (PL)

(72) Inventor: Marek Walaszek, Warsaw (PL)

( * ) Notice: Subject to any disclaimer, the term of this patent is extended or adjusted under 35 U.S.C. 154(b) by 0 days.

(21) Appl. No.: 15/988,092

(22) Filed: May 24, 2018

(65) Prior Publication Data

US 2019/0280663 A1    Sep. 12, 2019

(51) Int. Cl.
*H03G 3/00* (2006.01)
*H03F 3/183* (2006.01)

(52) U.S. Cl.
CPC ............. *H03G 3/001* (2013.01); *H03F 3/183* (2013.01); *H03F 2200/03* (2013.01)

(58) Field of Classification Search
CPC ................................. H03G 3/00; H03F 3/183
See application file for complete search history.

(56) References Cited

U.S. PATENT DOCUMENTS

| 4,479,240 A | 10/1984 | McKinley, Jr. |
| 6,239,655 B1 | 5/2001 | Orozov |

*Primary Examiner* — Patricia T Nguyen
(74) *Attorney, Agent, or Firm* — Ellenoff Grossman & Schole LLP; James M. Smedley; Alex Korona (57) ABSTRACT

An analog device control system is disclosed. The analog device control system has an analog device control module, comprising computer-executable code stored in non-volatile memory, a processor, and an analog device. The analog device control module, the processor, and the analog device are configured to use the analog device to receive an analog signal, digitally control the analog device using the analog device control module, and vary the analog signal using the analog device. Varying the analog signal is based on digitally controlling the analog device using the analog device control module.

21 Claims, 6 Drawing Sheets

SYSTEM AND METHOD FOR CONTROL OF AN ANALOG DEVICE

RELATED APPLICATIONS

This application claims the benefit of Polish Patent Application No. P.424779 filed Mar. 6, 2018, which is hereby incorporated by reference in its entirety

TECHNICAL FIELD

The present disclosure generally relates to a system and method for control of a device, and more particularly to a system and method for control of an analog device.

BACKGROUND

Figure 1:
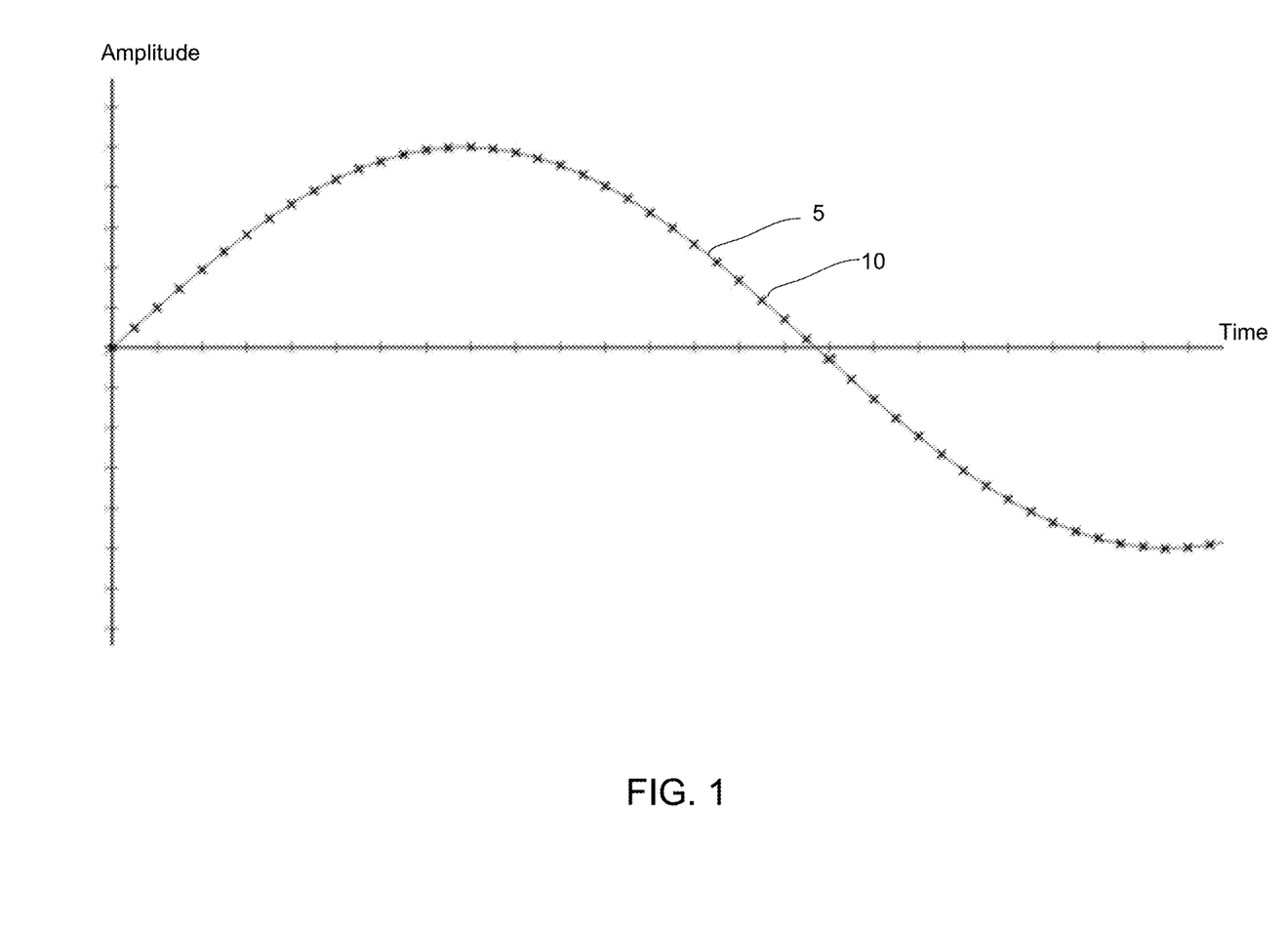
FIG. 1 is an illustration of known types of signals.

Types of electronic audio signals include analog signals and digital signals. Analog signals may have the shape of a continuous-time electronic signal that is a direct representation of an acoustic wave. Unlike analog signals, digital signals are not continuous in time and are instead discretized. FIG. 1 illustrates a graph showing a continuous analog signal 5 and a discretized digital signal 10. The discretization process that generates digital signals, in which values are retrieved at specific points in time, is a loss-inducing operation regarding sound information. However, because the human auditory system does not receive relatively highest acoustic frequencies, but instead receives their specific band (and in accordance with conventional sampling theorems such as the Kotelnikov-Shannon theorem), digital signals are still considered useful even though sound information is lost.

Many audio engineers prefer using analog devices that work with analog signals over digital devices, believing that analog devices have better acoustic characteristics. However, a disadvantage with analog devices is that the user typically relies on memory each time new parameter settings are made. It is also difficult to store parameter changes as a function of time, and changing these values as a function of time involves dedicated personnel to mechanically change settings.

U.S. Pat. No. 4,479,240 (the '240 patent, titled "Audio mixing console with control element position storage") discloses an audio playing system with an improved sound mixing console, which allows a user to immediately record the position of control elements on mixing console modules. The '240 patent also discloses allowing a sound engineer to recall stored control positions and to indicate stored positions with pairs of LEDs placed next to each control element of a console. However, a user who wants to recall a specific setting (for example, a previous music project) after some time still applies manual settings (e.g., turning each of a plurality of knobs assigned to specific parameters).

Another reference, U.S. Pat. No. 6,239,655 (the '655 patent, titled "Microphone amplifier with digital gain control"), discloses a digitally controlled component of an analog audio path. However, the system of the '655 patent merely discloses an amplifier that does not appear to be intended to interfere with signals in aspects other than amplitude.

The exemplary disclosed system and method are directed to overcoming one or more of the shortcomings set forth above and/or other deficiencies in existing technology.

SUMMARY OF THE DISCLOSURE

In one exemplary aspect, the present disclosure is directed to an analog device control system. The analog device control system includes an analog device control module, comprising computer-executable code stored in non-volatile memory, a processor, and an analog device. The analog device control module, the processor, and the analog device are configured to use the analog device to receive an analog signal, digitally control the analog device using the analog device control module, and vary the analog signal using the analog device. Varying the analog signal is based on digitally controlling the analog device using the analog device control module.

In another aspect, the present disclosure is directed to a method. The method includes receiving an analog audio signal using an analog device, using an adjustment part to make a first setting change value of the analog device to vary the analog audio signal at a first time point, and storing a first data that includes the first setting change value and the first time point. The method also includes using the adjustment part to make a second setting change value of the analog device to vary the analog audio signal at a second time point, and storing a second data that includes the second setting change value and the second time point.

DETAILED DESCRIPTION AND INDUSTRIAL APPLICABILITY

Figure 2:
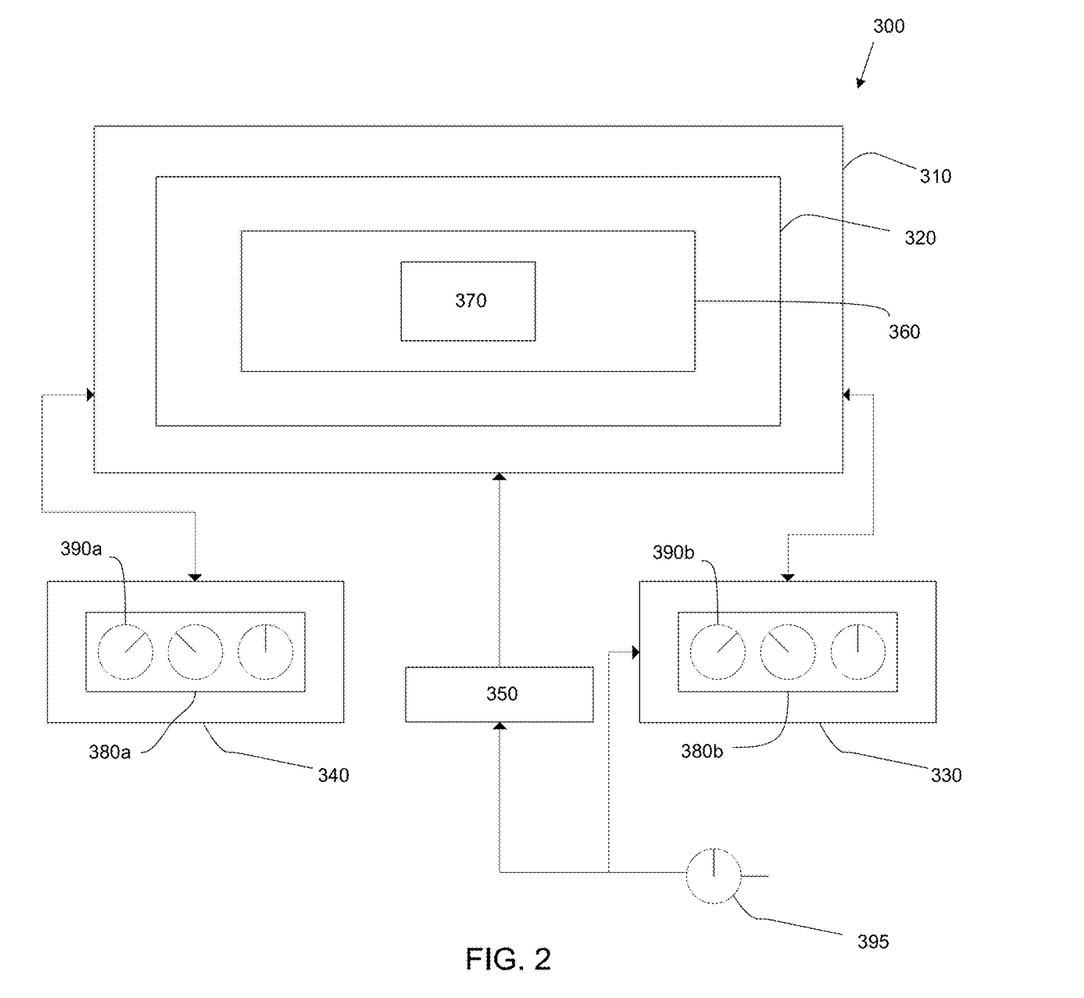
FIG. 2 is a schematic view of an exemplary system of the present invention.

FIG. 2 illustrates an exemplary system 300 for control of an analog device. In at least some exemplary embodiments, system 300 may control (e.g., digitally control) an analog device for processing (e.g., altering, interfering with, disrupting, recording, storing, playing, and/or any other desired type of processing) audio signals such as analog audio signals. System 300 may be used in any desired audio signal processing application such as, for example, recording studio applications, media applications such as television, movie, radio, musical performance applications, and/or any other desired type of application involving processing audio signals.

As illustrated in FIG. 2, system 300 may include a computing device 310, an analog device control module 320, an analog device 330, and one or more user interfaces 340 and/or 350. As described further below, computing device 310 and/or analog device control module 320 may be used to control analog device 330 via a user using one or more user interfaces 340 and 350. Computing device 310, analog device control module 320, analog device 330, and one or more user interfaces 340 and/or 350 may be directly connected (e.g., by wire, cable, and/or any other suitable electro-mechanical connection) to each other and/or connected via a network that may be similar to the exemplary network disclosed below regarding FIG. 7. System 300 may also include communication components that may be any suitable devices for communicating data between the various components of system 300 either directly or via network communication. For example, system 300 may include any suitable transceiver devices (e.g., transmitter device and/or receiver device) for transmitting data between components of system 300 and also for receiving data from other components of system 300. System 300 may also include a plurality of computing devices 310, a plurality of exemplary user interfaces, and/or a plurality of any other components of system 300 that may be in direct communication and/or connected via network. For example, components of system 300 may receive and transmit data as disclosed below regarding exemplary communication techniques of FIG. 7. For example, components of system 300 may wirelessly transmit data by any suitable technique such as, e.g., wirelessly transmitting data via 4G LTE networks (e.g., or any other suitable data transmission technique for example via network communication).

Computing device 310 may be generally similar to the exemplary computing device described below regarding FIG. 6. Analog device control module 320 may be partially or substantially entirely integrated with one or more components of system 300 such as, for example, computing device 310, analog device 330, exemplary network components, one or more user interfaces 340 and/or 350, and/or any other suitable components of system 300. Analog device control module 320 may include components similar to the exemplary components disclosed below regarding FIGS. 6 and 7. For example, analog device control module 320 may include computer-executable code stored in non-volatile memory. Analog device control module 320 may also include a processor, or alternatively, a processor for processing data associated with system 300 (e.g., of computing device 310) may be partially or substantially entirely integrated into any portion (e.g., or combination of portions) of system 300 (e.g., computing device 310, the exemplary network, one or more user interfaces 340 and/or 350, and/or analog device 330).

Analog device control module 320 may be configured to retrieve, store, process, and/or analyze data transmitted to and/or from computing device 310, analog device 330, exemplary network components, and/or one or more user interfaces 340 and/or 350. For example, analog device control module 320 may operate using data from any desired number of computing devices 310, analog devices 330, exemplary network components, and/or user interfaces 340 and/or 350.

Analog device control module 320 may perform analysis using data received from computing device 310, analog device 330, exemplary network components, and/or one or more user interfaces 340 and/or 350. For example, analog device control module 320 may utilize sophisticated machine learning and/or artificial intelligence techniques to perform predictive analysis using some or substantially all data of system 300. For example, system 300 (e.g., analog device control module 320) may utilize data to prepare and submit (e.g., via exemplary network components, for example via wireless transmission such as via 4G LTE networks) datasets and variables to cloud computing clusters and/or other analytical tools (e.g., predictive analytical tools) which may analyze such data using artificial intelligence neural networks. System 300 may for example include cloud computing clusters performing predictive analysis. For example, system 300 may utilize neural network-based artificial intelligence to predictively assess data related to user interaction (e.g., as disclosed below). The exemplary neural network may include a plurality of input nodes that may be interconnected and/or networked with a plurality of additional and/or other processing nodes to determine a predicted result (e.g., desired adjustments for audio signals). For example, exemplary artificial intelligence processes may include filtering and processing datasets, processing to simplify datasets by statistically eliminating irrelevant, invariant or superfluous variables or creating new variables which are an amalgamation of a set of underlying variables, and/or processing for splitting datasets into train, test and validate datasets using at least a stratified sampling technique. For example, exemplary artificial intelligence processes may also include processing for training a machine learning model to predict outcomes related to user interactions. For example, the prediction algorithms and approach may include regression models, tree-based approaches, logistic regression, Bayesian methods, deep-learning and neural networks both as a stand-alone and on an ensemble basis, and final prediction may be based on the model/structure which delivers the highest degree of accuracy and stability as judged by implementation against the test and validate datasets. Also for example, exemplary artificial intelligence processes may include processing for training a machine learning model to predict outcomes related to data of system 300.

Analog device control module 320 may include an audio module 360 and a settings data module 370. Audio module 360 may for example include an effect plug-in such as an audio effect plug-in that may enhance audio functionality of an audio signal (e.g., an analog audio signal) processed by system 300. Audio module 360 may be associated with graphic user interface components that may be displayed on one or more user interfaces 340 and/or 350. Settings data module 370 may be any suitable data storage component for storing settings data of analog device 330 as described further below.

Analog device control module 320 may be controlled by a user via one or more user interfaces 340 and/or 350 or controlled by system 300 using automated processes such as artificial intelligence processes described above to process (e.g., altering, interfering with, disrupting, recording, storing, playing, and/or any other desired type of processing) audio signals via digital control of analog device 330.

System 300 (e.g., analog device control module 320) may automatically save and load desired parameter values of audio signals based on a user's operation (e.g., or automated operation) of analog device 330. In at least some exemplary embodiments of the present invention, system 300 may provide a method of digital control of analog device 330 for analog modification of audio signals. Also, system 300 may streamline user operation when values of audio signal parameters are changed as a function of time (e.g., changed in time), and may store digital data of analog settings of analog device 330 as a function of time. For example, analog device control module 320 may store data of analog settings in settings data module 370 using audio module 360. In at least some exemplary embodiments of the present invention, system 300 may digitally control an operation of analog device 330 based on an operation of analog device control module 320.

In at least some exemplary embodiments of the present invention, system 300 may provide a digital method for controlling analog device 330 to perform analog modification of audio signals based on launching analog device control module 320 on computing device 310. Audio module 360 (e.g., an effect plug-in such as an audio plug-in) may be launched within analog device control module 320, and may communicate via system 300 with receivers of information regarding parameters of analog audio processing features. Audio module 360 may be in communication with (e.g., may receive, transmit, and/or process data of and/or control) analog device 330 and other components of computing device 310 and/or analog device control module 320. By using system 300, a user may use analog device control module 320 to update settings data of settings data module 370 and control analog device 330 to make corresponding changing to settings (e.g., controlling a processing of analog signals by analog device 330 and/or storing data of settings of analog device 330 as a function of time).

Figure 3:
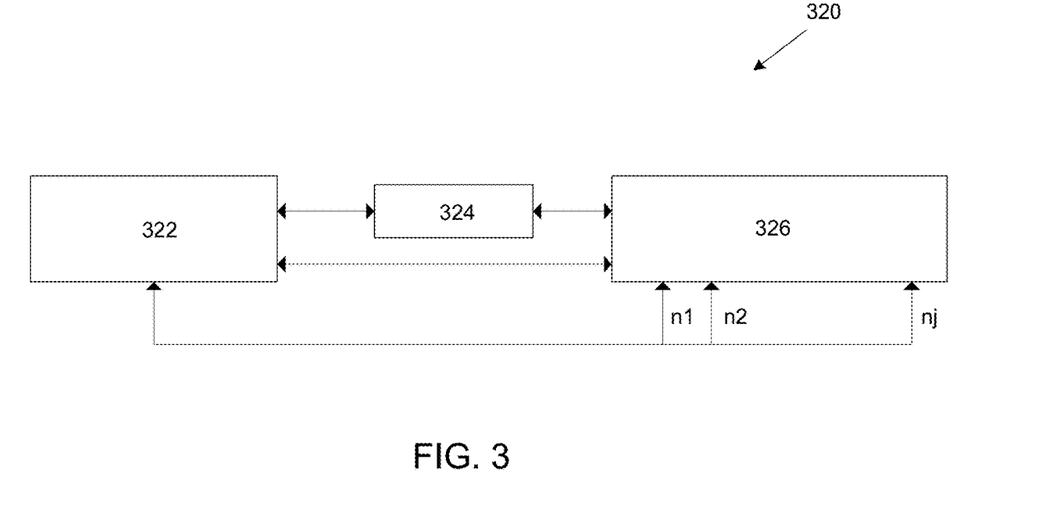
FIG. 3 is a schematic view of an exemplary embodiment of the present invention.

Analog device control module 320 may be any suitable digital module for controlling an operation of analog device 330. For example, analog device control module 320 (e.g., including components of computing device 310) may be any suitable control module for controlling and/or storing data associated with an operation of analog device 330. FIG. 3 for example illustrates an exemplary configuration and operation of aspects of analog device control module 320, including exemplary effect plug-ins. Analog device control module 320 may include exemplary components 322, 324, and 326 in an exemplary configuration that may process digital audio signal with a specified audio data exchange buffer in accordance with an exemplary function (e.g., with j adjustable parameters illustrated as n1, n2, . . . nj). Analog device control module 320 may provide an audio signal to a data exchange buffer and may include internal mechanisms of storing the j adjustable parameters, as well as a control data bus for exchanging data (e.g., as illustrated by the exemplary data flows between components 322, 324, and 326).

Figure 4:
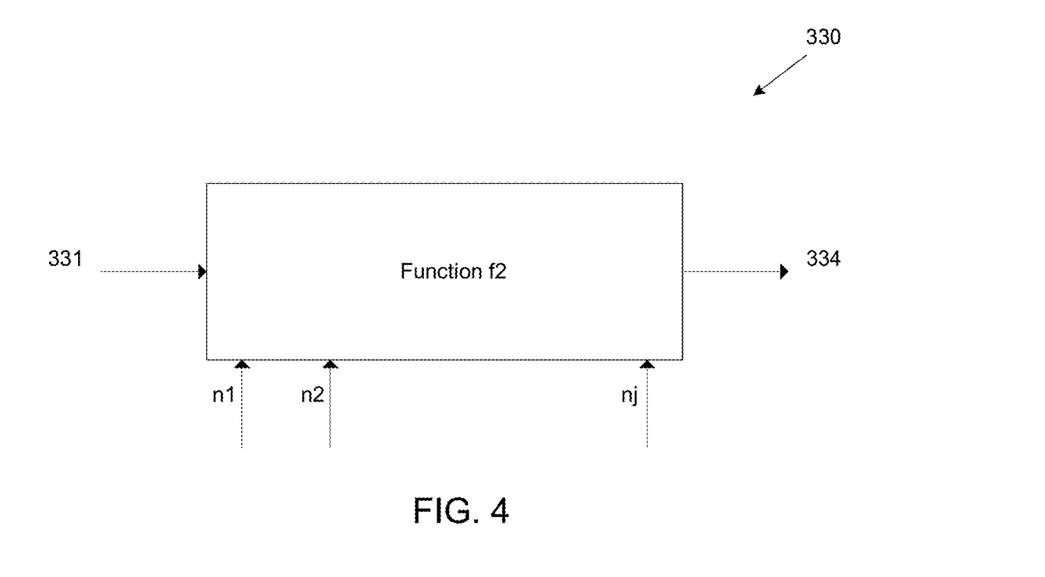
FIG. 4 is a schematic view of an exemplary embodiment of the present invention.

Analog device 330 may be any suitable analog device for processing (e.g., altering, interfering with, disrupting, recording, storing, playing, and/or any other desired type of processing) analog audio signals. For example, analog device 330 may be any suitable device for analog audio signal processing of analog signals such as music, sound recordings, and/or any other desired type of sound information. FIG. 4 for example illustrates an exemplary configuration and operation of aspects of analog device 330. For example, analog device 330 may receive and process analog audio signal provided at an input 331 (e.g., an input signal $s_{we}(t)$). Analog device 330 may process the analog audio signal based on predetermined, user-selected, and/or system-determined criteria such as, for example, a function f2 with j adjustable parameters (e.g., n1, n2, . . . nj) used to vary audio signal processing based on function f2. The signal may then be released from analog device 330 at output 334 (e.g., a processed signal $s_{wy}(t)$).

Returning to the exemplary illustration of FIG. 2, one or more user interfaces 340 and/or 350 may be any suitable user interface for receiving input and/or providing output (e.g., audio signal data) to a user such as a sound engineer. For example, one or more user interfaces 340 and/or 350 may include a touchscreen device (e.g., of a smartphone, a tablet, a smartboard, and/or any suitable computer device), a computer keyboard and monitor (e.g., desktop or laptop), an audio-based device for entering input and/or receiving output via sound, a tactile-based device for entering input and receiving output based on touch or feel, a dedicated user interface designed to work specifically with other components of system 300, and/or any other suitable user interface (e.g., including components and/or configured to work with components described below regarding FIGS. 6 and 7). For example, one or more user interfaces 340 and/or 350 may include a touchscreen device of a smartphone or handheld tablet. Also for example, one or more user interfaces 340 and/or 350 may include input and/or output devices for a user such as a sound engineer to enter input and receive output from system components for controlling an analog audio device such as analog device 330. For example, one or more user interfaces 340 and/or 350 may include a display (e.g., a computing device display, a touchscreen display, and/or any other suitable type of display) that may provide analog audio data, raw data, and/or predictive analysis results to a user. For example, the exemplary display may include a graphical user interface to facilitate entry of input by a user and/or receiving output. For example, a user may utilize one or more user interfaces 340 and/or 350 to manipulate raw data results and/or enter parameters to define a set of desired output. In at least some exemplary embodiments, user interface 350 may serve as an input hardware device for a user to control system 300. For example, a user may use user interface 350 to control computing device 310 and analog device control module 320 to control analog device 330 and other components of system 300.

In at least some exemplary embodiments, user interface 340 may include a display 380a. Display 380a may for example include images displayed on user interface 340, a graphical user interface displayed on a touchscreen that may be manipulated by a user, and/or any other desired type of display. Display 380a may display one or more objects 390a. Objects 390a may provide visual output of data processed and/or stored by analog device control module 320 and/or settings data module 370. For example, objects 390a may serve as readouts of data stored by settings data module 370 describing settings of analog device 330. A user may determine settings of analog device 330 based on observing readout data (e.g., output data) of one or more objects 390a displayed on display 380a (e.g., a graphical user interface and/or a passive monitor display) of user interface 340.

In at least some exemplary embodiments, analog device 330 may include a display 380b. Display 380b may for example include images displayed on a touchscreen graphical user interface or a passive monitor, an LED light display, and/or any other suitable display for an analog device. Display 380b may include one or more objects 390b. Objects 390b may display similar information as objects 390a of display 380a of user interface 340. For example, objects 390b may display setting information describing settings of analog device 330, which may be similar to data displayed by objects 390a of data processed and/or stored by analog device control module 320 and/or settings data module 370. For example, in addition to referring to objects 390a that may serve as readouts of data stored by settings data module 370 that describe settings of analog device 330, a user of system 300 may also refer to objects 390b displayed on display 380b of analog device 330. For example, a user may determine settings of analog device 330 based on observing one or more objects 390b displayed on display 380b of analog device 330.

System 300 may also include one or more adjustment parts 395. Adjustment parts 395 may adjust settings of analog device 330 and settings data of settings data module 370 (e.g., which may store settings data describing settings of analog device 330). For example, a user of system 300 may adjust adjustment parts 395 to directly change settings of analog device 330 (e.g., which may be processed and/or recorded by analog device control module 320) and/or change settings of analog device 330 using analog device control module 320 (e.g., using system 300 to digitally control an operation of analog device 330). Adjustment parts 395 may be in any desired form in system 300. For example, adjustment parts 395 may be physical (e.g., mechanical) components that are disposed on one or more devices of system 300. One or more adjustment parts 395 may be disposed on analog device 330 and/or user interface 350 (e.g., and/or user interface 340). For example, one or more adjustment parts 395 may be physical components such as knobs, dials, levers, switches, and/or any other suitable physical (e.g., mechanical) component for adjusting an analog signal. For example, one or more adjustment parts 395 may be knobs disposed on analog device 330.

One or more adjustment parts 395 may also be integrated into audio module 360. For example, adjustment parts 395 may be audio effect plug-ins of analog device control module 320 (e.g., audio module 360) that may be displayed on user interface 340 and manipulated by a user using system 300. For example, a user may use system 300 to adjust settings data of settings data module 370 (e.g., thereby controlling settings and an operation of analog device 330). For example, system 300 may control analog device 330 to change settings based on adjustments made using adjustment parts 395 that may be audio effect plug-ins. Adjustment parts 395 may be objects displayed on user interface 340 that may be manipulated by a user. Adjustment parts 395 may be integrated into objects 390a and/or any other desired object that may be displayed on display 380a of user interface 340 and manipulated by a user. Adjustment parts 395 may be integrated into any exemplary user interface components of system 300 described above.

In at least some exemplary embodiments, objects 390a and/or 390b may be adjustment parts. For example, objects 390a and/or 390b may be adjustment parts that are disposed on or inside an exemplary display of analog device 330 and/or user interface 340. For example in an exemplary embodiment, reference numeral 395 may represent a user of system 300, and user 395 may have a feedback loop with system 300 by operating objects 390a and/or 390b that are adjustment parts as disclosed for example herein.

In at least some exemplary embodiments, a user (e.g., a sound engineer, technician, artist, and/or any other user) may receive output from and enter input to system 300 via one or more user interfaces 340 and/or 350. For example, the user may read readouts of settings data on objects 390a and/or 390b and control analog device 330 by adjusting adjustment parts 395 that may be physical (e.g., mechanical) components disposed on hardware components of system 300 and/or effect plug-ins integrated into analog device control module 320 (e.g., audio module 360). System 300 may also automatically, digitally control analog device 330 based on predetermined criteria and/or exemplary machine learning processes described for example above.

In at least some exemplary embodiments, the exemplary disclosed system (e.g., system 300) may include an analog device control module (e.g., analog device control module 320), comprising computer-executable code stored in non-volatile memory, a processor, and an analog device (e.g., analog device 330). The analog device control module, the processor, and the analog device may be configured to use the analog device to receive an analog signal, digitally control the analog device using the analog device control module, and vary the analog signal using the analog device. Varying the analog signal may be based on digitally controlling the analog device using the analog device control module. Digitally controlling the analog device may include manipulating an effect plug-in (e.g., adjustment part 395 that may be an effect plug-in) using a user interface (e.g., one or more user interfaces 340 and/or 350). Digitally controlling the analog device may include changing settings of the analog device at a plurality of time points. The analog device control module may store data of each setting change value at each of the plurality of time points. The analog device control module may control the analog device to vary the analog signal based on the stored data. The data of each setting change value may be stored as a function of time. The analog device control module may store the data during a first time period. The analog device control module may control the analog device to vary the analog signal based on the stored data during a second time period following the first time period. Digitally controlling the analog device may include using machine learning processes.

In at least some exemplary embodiments, the exemplary disclosed system (e.g., system 300) may include an analog device control module (e.g., analog device control module 320), comprising computer-executable code stored in non-volatile memory, a processor, an effect plug-in (e.g., audio module 360) included in the analog device control module, a user interface (e.g., one or more user interfaces 340 and/or 350), and an analog device (e.g., analog device 330). The analog device control module, the processor, the effect plug-in, the user interface and the analog device may be configured to use the analog device to receive an analog audio signal, digitally control the analog device using the analog device control module, and vary the analog audio signal using the analog device. Varying the analog audio signal may be based on digitally controlling the analog device using the analog device control module. Digitally controlling the analog device may include manipulating the effect plug-in using the user interface. The effect plug-in may be an audio effect plug-in having an interface that is displayed on the user interface. Digitally controlling the analog device may include changing settings of the analog device at a plurality of time points. The analog device control module may store data of each setting change value at each of the plurality of time points. The analog device control module may control the analog device to vary the analog audio signal based on the stored data.

The exemplary disclosed system and method may be used in any suitable application involving audio signals. For example, system 300 may be used in any suitable application for controlling an analog device for processing audio signals such as analog audio signals. System 300 may be used in any desired audio signal processing application such as, for example, recording applications, media applications such as television, movie, radio, musical performance applications, and/or any other desired type of application involving processing audio signals. For example, system 300 may be used in professional audio recording studios.

Figure 5:
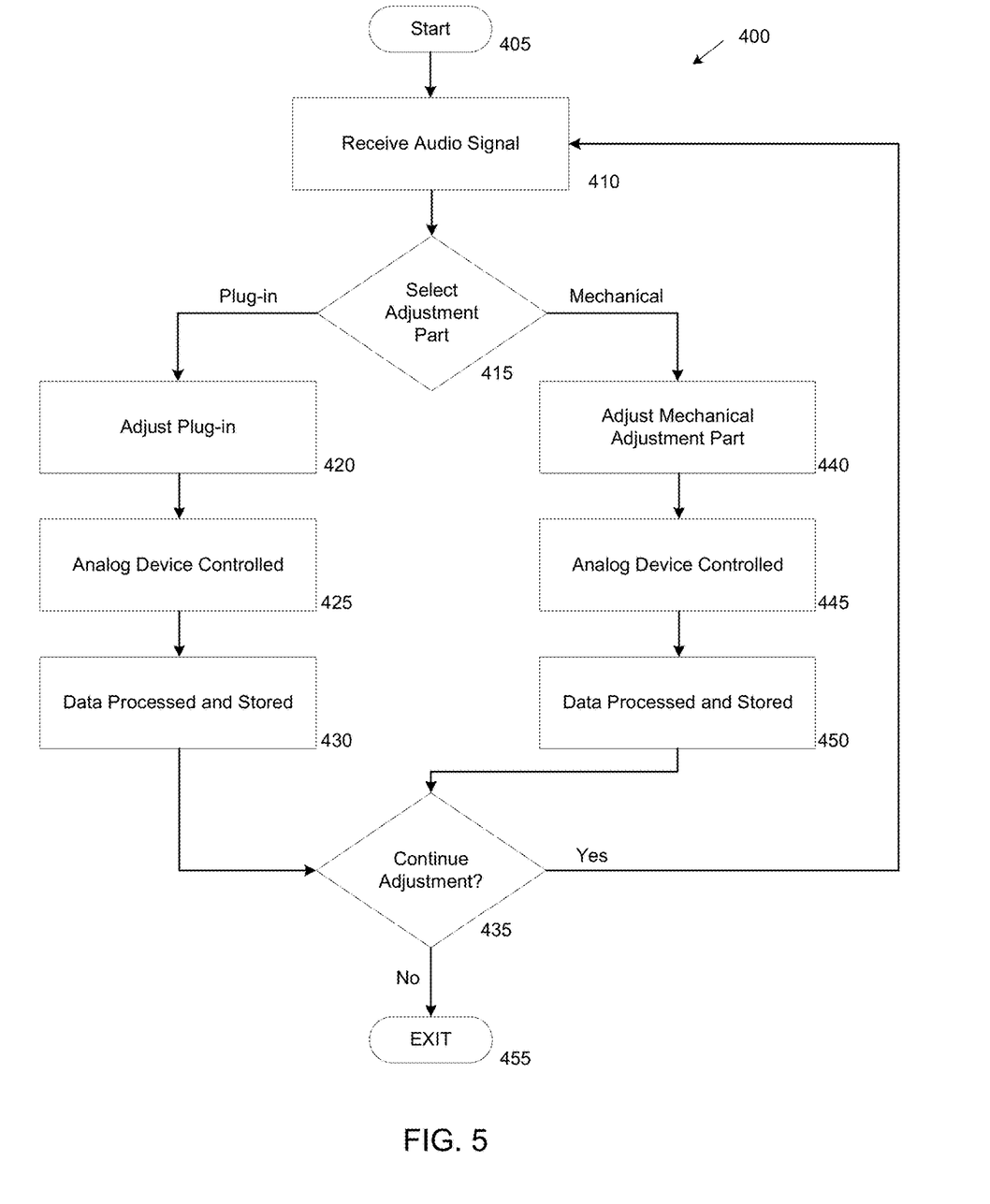
FIG. 5 illustrates an exemplary process of the present invention.

An exemplary operation of the exemplary disclosed system and method will now be described. FIG. 5 illustrates an exemplary process 400 for control of an analog device. Process 400 starts at step 405. At step 410, system 300 may receive an audio signal such as an analog audio signal received by analog device 330. System 300 may process (e.g., alter, interfere with, disrupt, record, store, play, and/or any perform any other desired type of processing) the analog audio signal as a function of time based on communication of computing device 310 and analog device control module 320 with other components of system 300.

At step 415, a user may make changes to the audio signal by adjusting settings of analog device 330. The user may decide to adjust the signal by using one or more adjustment parts 395 that may be plug-in adjustment parts or mechanical adjustment parts.

At step 420, the user may adjust one or more adjustment parts 395 that may be effects plug-ins such as, for example, adjustment parts 395 that are integrated in audio module 360 and that may be displayed as objects 390a on display 380a and manipulated by a user via one or more user interfaces 340 and/or 350. For example, the user may view objects 390a on display 380a and use one or more user interfaces 340 and/or 350 to adjust settings of analog device 330 by adjusting objects 390a (e.g., via use of a touchscreen graphical user interface, a movable cursor, and/or any other suitable technique for making adjustments using a computing device). Analog device control module 320 (e.g., settings data module 370) may process and store data describing the settings changes to analog device 330 as a function of time (e.g., storing data of settings that were changed and data of the time points at which the settings were changed).

At step 425, system 300 may control (e.g., digitally control) analog device 330 to adjust settings of the analog audio signal being received by analog device 330. System 300 may for example control analog device 330 to adjust settings in substantially real-time and process and/or store data describing the adjustments to the settings of analog device 330 at step 430. System 300 may substantially fully process (e.g., alter, interfere with, disrupt, record, store, play, and/or any perform any other desired type of processing) data describing substantially all adjustments made by a user to the audio signal using one or more adjustment parts 395 as a function of time. A user may use system 300 to later utilize the processed data to re-create any desired settings and/or adjustments to settings as a function of time. For example, a user may use system 300 to automatically perform any desired settings adjustments made to any portions of a song that were previously processed (e.g., recorded). For example, the user may use system 300 to repeat previously-made settings adjustments as desired (e.g., when a previously-processed song is again being performed).

The user may determine at step 435 whether additional adjustments may be made to analog device 330. If additional adjustments are to be made, system 300 may return to step 410. The user may either make an additional adjustment using one or more adjustments parts 395 that are plug-ins as described above regarding steps 420, 425, and 430, and/or may use one or more adjustment parts 395 that are physical (e.g., mechanical) adjustment parts as described below.

At step 440, the user may adjust one or more adjustment parts 395 that may be physical (e.g., mechanical) adjustment parts disposed for example on analog device 330, user interface 350, and/or any other suitable component of system 300 as described for example above.

At step 445, system 300 (e.g., analog device control module 320) may update settings of settings data module 370 based on the adjustment made to the settings of analog device 330 via one or more adjustment parts 395 that may be mechanical components. Analog device 330 may be controlled directly by adjustment of one or more adjustment parts 395 that may be mechanical components.

At step 450, similar to at step 430 described above, system 300 may substantially fully process (e.g., alter, interfere with, disrupt, record, store, play, and/or any perform any other desired type of processing) data describing substantially all adjustments made by a user to the audio signal using one or more adjustment parts 395 (e.g., that may be mechanical components) as a function of time. Similar to at step 430 described above, a user may use system 300 to later utilize the processed data to re-create any desired settings and/or adjustments to settings as a function of time.

The user may again determine at step 435 whether additional adjustments may be made to analog device 330 using one or more adjustments parts 395 that may be plug-ins as described above regarding steps 420, 425, and 430, and/or may use one or more adjustment parts 395 that may be physical (e.g., mechanical) adjustment parts as described above regarding steps 440, 445, and 450. System 300 may return to step 410 to repeat the process described above as many times as desired. In addition to proceeding based on a user's control, system 300 may also perform some or substantially all steps of process 400 based on automatic control by system 300 based on predetermined criteria and/or exemplary machine learning processes described above. Process 400 may end at step 455.

In at least some exemplary embodiments, connections for audio source and output may be made based on a user's desired criteria. For example, analog device 330 and/or other exemplary components of system 300 may have a pair of analog audio signal inputs and outputs for each analog audio signal path.

In at least some exemplary embodiments, the exemplary system and method may provide a user with a technique for storing and/or changing parameters for adjusting settings of an analog device. For example, analog device control module 320 may be launched on a computing device 310 having a suitable operating system. Within analog device control module 320, audio module 360 that may be an effect plug-in may be launched and may communicate with a plurality of sources (e.g., receivers of information on parameters of analog audio processing features): an analog device 330, analog device control module 320, and a user. Also, system 300 may include a user interface 340 that may provide readouts of settings data stored on settings data module 370 and one or more adjustment parts 395 that may allow for changing the settings data that include settings values for analog device 330.

In at least some exemplary embodiments, a user may set desired parameter values for specific points in time, and then save a project (e.g., a music project) and return to the project at any time and/or replay the project with automatically changing parameters based on data of the project that was saved. System 300 may provide combined digital-analog features in which desired parameter values are set digitally via a computing device (e.g., computer with an operating system and monitor), while sound is processed in an analog domain within a device used to modify audio signals (e.g., analog device 330).

In at least some exemplary embodiments, system 300 may allow for switch integrated circuits, which may eliminate mechanical contacts that may be the relatively least reliable link in an audio device for producing quality signal processing. Also, system 300 may allow for significantly greater accuracy of set parameters (e.g., setting parameters) and efficient repeatability of settings. Also for example, system 300 may allow for relatively accurate descriptions of parameter values, and may not reduce a number of possible settings. System 300 may provide sufficiently high resolution of parameter settings and accurate descriptions of set values (e.g., setting values).

In at least some exemplary embodiments, the exemplary disclosed method may include receiving an analog audio signal using an analog device (e.g., analog device 330), using an adjustment part (e.g., adjustment part 395) to make a first setting change value of the analog device to vary the analog audio signal at a first time point, and storing a first data that includes the first setting change value and the first time point. The exemplary disclosed method may also include using the adjustment part to make a second setting change value of the analog device to vary the analog audio signal at a second time point, and storing a second data that includes the second setting change value and the second time point. The adjustment part may be a mechanical component disposed on the analog device. For example, the adjustment part may be a knob disposed on the analog device. The exemplary method may further include controlling the analog device to vary the analog audio signal based on the first data and the second data. The first data and the second data may be stored during a first time period. The exemplary method may vary the analog audio signal based on the first data and the second data during a second time period following the first time period.

The exemplary disclosed system and method may provide an effective technique for improving the quality of work product created by using electronic acoustic devices. The exemplary disclosed system and method may also allow an efficient technique for processing analog audio signals, and/or automatically saving and loading desired parameter settings without additional actions by a user. Further, the exemplary disclosed system and method may significantly streamline user operation when parameter values are changed over time, for example during parameter changes within a music project such as a song. Additionally, the exemplary disclosed system and method may allow users who for example prefer working with analog audio signals to control their analog modifying equipment via digital techniques.

Figure 6:
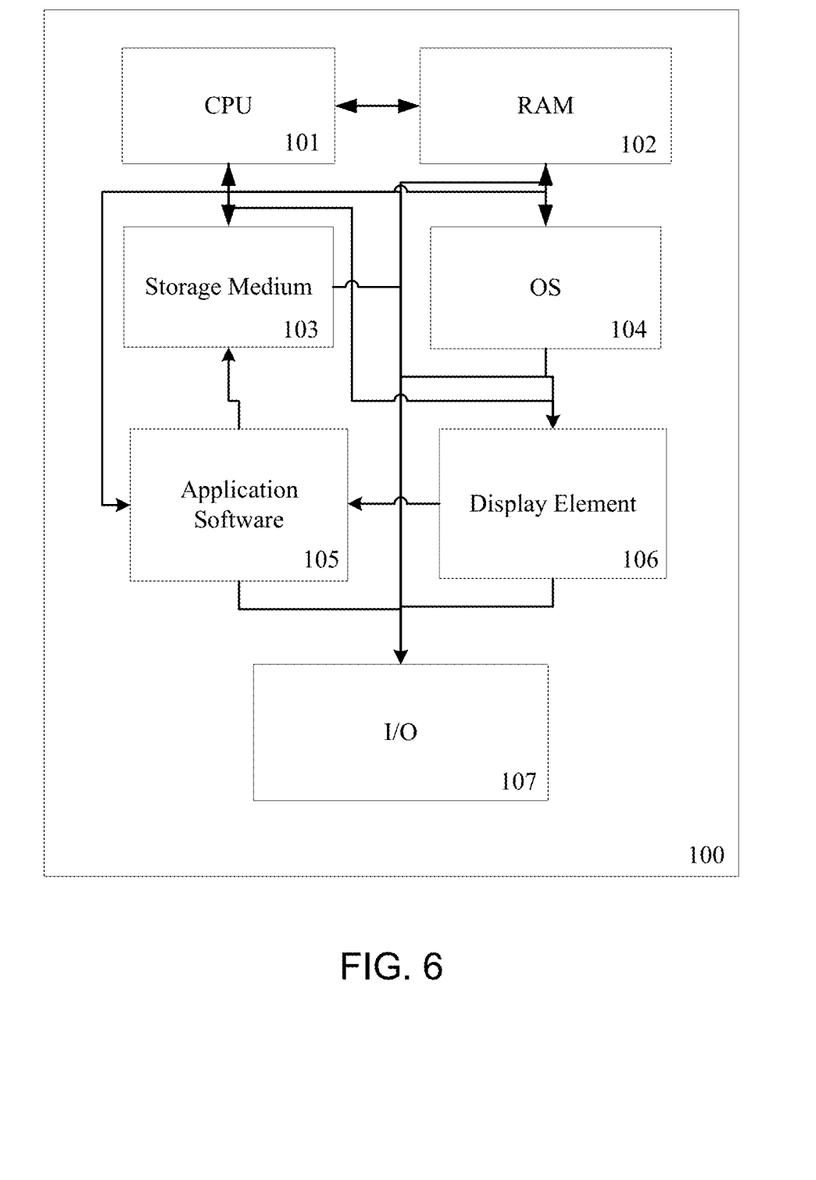
FIG. 6 is a schematic illustration of an exemplary computing device, in accordance with at least some exemplary embodiments of the present disclosure.

An illustrative representation of a computing device appropriate for use with embodiments of the system of the present disclosure is shown in FIG. 6. The computing device 100 can generally be comprised of a Central Processing Unit (CPU, 101), optional further processing units including a graphics processing unit (GPU), a Random Access Memory (RAM, 102), a mother board 103, or alternatively/additionally a storage medium (e.g., hard disk drive, solid state drive, flash memory, cloud storage), an operating system (OS, 104), one or more application software 105, a display element 106, and one or more input/output devices/means 107, including one or more communication interfaces (e.g., RS232, Ethernet, Wifi, Bluetooth, USB). Useful examples include, but are not limited to, personal computers, smart phones, laptops, mobile computing devices, tablet PCs, touch boards, and servers. Multiple computing devices can be operably linked to form a computer network in a manner as to distribute and share one or more resources, such as clustered computing devices and server banks/farms.

Various examples of such general-purpose multi-unit computer networks suitable for embodiments of the disclosure, their typical configuration and many standardized communication links are well known to one skilled in the art, as explained in more detail and illustrated by FIG. 7, which is discussed herein-below.

According to an exemplary embodiment of the present disclosure, data may be transferred to the system, stored by the system and/or transferred by the system to users of the system across local area networks (LANs) (e.g., office networks, home networks) or wide area networks (WANs) (e.g., the Internet). In accordance with the previous embodiment, the system may be comprised of numerous servers communicatively connected across one or more LANs and/or WANs. One of ordinary skill in the art would appreciate that there are numerous manners in which the system could be configured and embodiments of the present disclosure are contemplated for use with any configuration.

In general, the system and methods provided herein may be employed by a user of a computing device whether connected to a network or not. Similarly, some steps of the methods provided herein may be performed by components and modules of the system whether connected or not. While such components/modules are offline, and the data they generated will then be transmitted to the relevant other parts of the system once the offline component/module comes again online with the rest of the network (or a relevant part thereof). According to an embodiment of the present disclosure, some of the applications of the present disclosure may not be accessible when not connected to a network, however a user or a module/component of the system itself may be able to compose data offline from the remainder of the system that will be consumed by the system or its other components when the user/offline system component or module is later connected to the system network.

Figure 7:
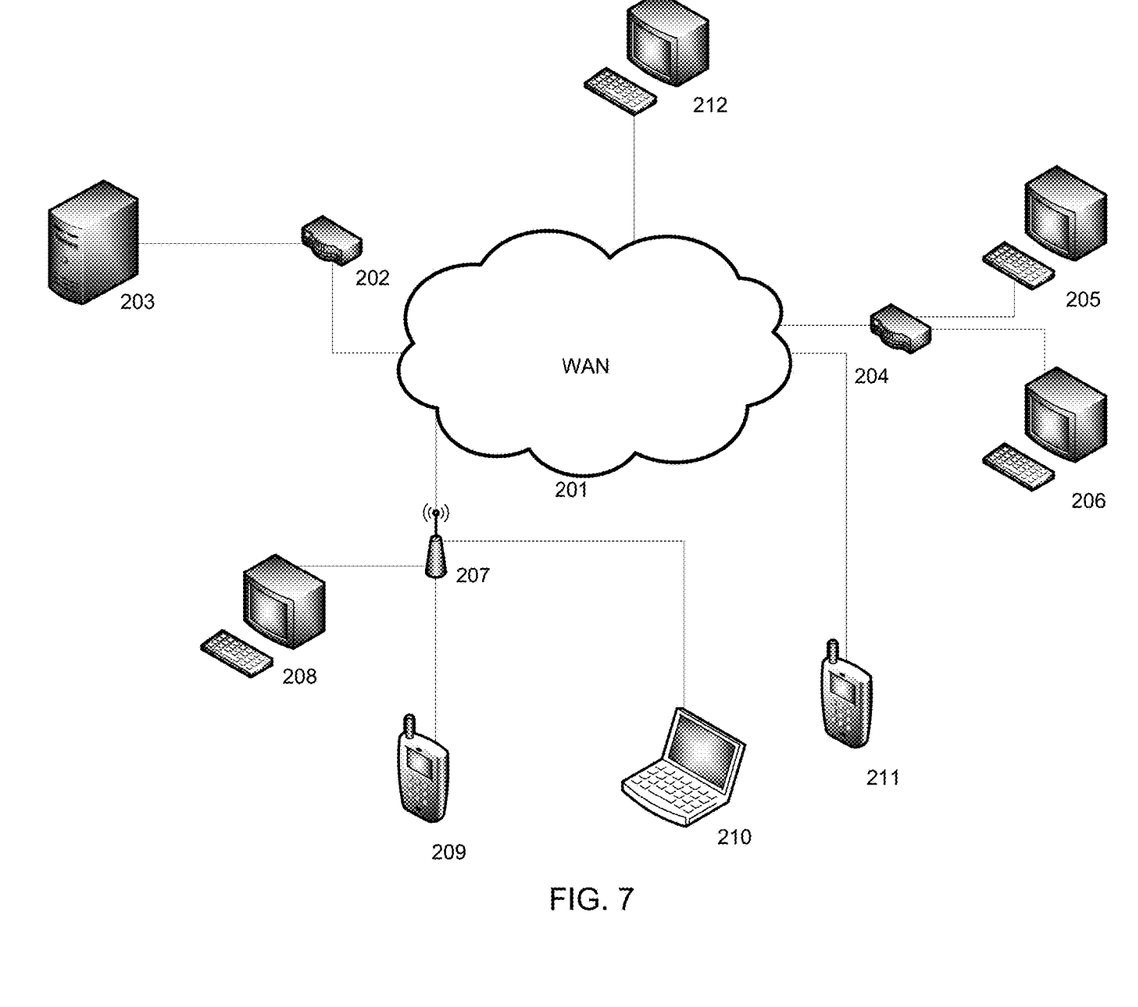
FIG. 7 is a schematic illustration of an exemplary network, in accordance with at least some exemplary embodiments of the present disclosure.

Referring to FIG. 7, a schematic overview of a system in accordance with an embodiment of the present disclosure is shown. The system is comprised of one or more application servers 203 for electronically storing information used by the system. Applications in the server 203 may retrieve and manipulate information in storage devices and exchange information through a WAN 201 (e.g., the Internet). Applications in server 203 may also be used to manipulate information stored remotely and process and analyze data stored remotely across a WAN 201 (e.g., the Internet).

According to an exemplary embodiment, as shown in FIG. 7, exchange of information through the WAN 201 or other network may occur through one or more high speed connections. In some cases, high speed connections may be over-the-air (OTA), passed through networked systems, directly connected to one or more WANs 201 or directed through one or more routers 202. Router(s) 202 are completely optional and other embodiments in accordance with the present disclosure may or may not utilize one or more routers 202. One of ordinary skill in the art would appreciate that there are numerous ways server 203 may connect to WAN 201 for the exchange of information, and embodiments of the present disclosure are contemplated for use with any method for connecting to networks for the purpose of exchanging information. Further, while this application refers to high speed connections, embodiments of the present disclosure may be utilized with connections of any speed.

Components or modules of the system may connect to server 203 via WAN 201 or other network in numerous ways. For instance, a component or module may connect to the system i) through a computing device 212 directly connected to the WAN 201, ii) through a computing device 205, 206 connected to the WAN 201 through a routing device 204, iii) through a computing device 208, 209, 210 connected to a wireless access point 207 or iv) through a computing device 211 via a wireless connection (e.g., CDMA, GMS, 3G, 4G) to the WAN 201. One of ordinary skill in the art will appreciate that there are numerous ways that a component or module may connect to server 203 via WAN 201 or other network, and embodiments of the present disclosure are contemplated for use with any method for connecting to server 203 via WAN 201 or other network. Furthermore, server 203 could be comprised of a personal computing device, such as a smartphone, acting as a host for other computing devices to connect to.

The communications means of the system may be any means for communicating data, including image and video, over one or more networks or to one or more peripheral devices attached to the system, or to a system module or component. Appropriate communications means may include, but are not limited to, wireless connections, wired connections, cellular connections, data port connections, Bluetooth® connections, near field communications (NFC) connections, or any combination thereof. One of ordinary skill in the art will appreciate that there are numerous communications means that may be utilized with embodiments of the present disclosure, and embodiments of the present disclosure are contemplated for use with any communications means.

Traditionally, a computer program includes a finite sequence of computational instructions or program instructions. It will be appreciated that a programmable apparatus or computing device can receive such a computer program and, by processing the computational instructions thereof, produce a technical effect.

A programmable apparatus or computing device includes one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computing device can include any and all suitable combinations of at least one general purpose computer, special-purpose computer, programmable data processing apparatus, processor, processor architecture, and so on. It will be understood that a computing device can include a computer-readable storage medium and that this medium may be internal or external, removable and replaceable, or fixed. It will also be understood that a computing device can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the disclosure as claimed herein could include an optical computer, quantum computer, analog computer, or the like.

Regardless of the type of computer program or computing device involved, a computer program can be loaded onto a computing device to produce a particular machine that can perform any and all of the depicted functions. This particular machine (or networked configuration thereof) provides a technique for carrying out any and all of the depicted functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Illustrative examples of the computer readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A data store may be comprised of one or more of a database, file storage system, relational data storage system or any other data system or structure configured to store data. The data store may be a relational database, working in conjunction with a relational database management system (RDBMS) for receiving, processing and storing data. A data store may comprise one or more databases for storing information related to the processing of moving information and estimate information as well one or more databases configured for storage and retrieval of moving information and estimate information.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the depicted elements and the functions thereof may be implemented as parts of a monolithic software structure, as standalone software components or modules, or as components or modules that employ external routines, code, services, and so forth, or any combination of these. All such implementations are within the scope of the present disclosure. In view of the foregoing, it will be appreciated that elements of the block diagrams and flowchart illustrations support combinations of means for performing the specified functions, combinations of steps for performing the specified functions, program instruction technique for performing the specified functions, and so on.

It will be appreciated that computer program instructions may include computer executable code. A variety of languages for expressing computer program instructions are possible, including without limitation C, C++, Java, JavaScript, assembly language, Lisp, HTML, Perl, and so on. Such languages may include assembly languages, hardware description languages, database programming languages, functional programming languages, imperative programming languages, and so on. In some embodiments, computer program instructions can be stored, compiled, or interpreted to run on a computing device, a programmable data processing apparatus, a heterogeneous combination of processors or processor architectures, and so on. Without limitation, embodiments of the system as described herein can take the form of web-based computer software, which includes client/server software, software-as-a-service, peer-to-peer software, or the like.

In some embodiments, a computing device enables execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. The thread can spawn other threads, which can themselves have assigned priorities associated with them. In some embodiments, a computing device can process these threads based on priority or any other order based on instructions provided in the program code.

Unless explicitly stated or otherwise clear from the context, the verbs "process" and "execute" are used interchangeably to indicate execute, process, interpret, compile, assemble, link, load, any and all combinations of the foregoing, or the like. Therefore, embodiments that process computer program instructions, computer-executable code, or the like can suitably act upon the instructions or code in any and all of the ways just described.

The functions and operations presented herein are not inherently related to any particular computing device or other apparatus. Various general-purpose systems may also be used with programs in accordance with the teachings herein, or it may prove convenient to construct more specialized apparatus to perform the required method steps. The required structure for a variety of these systems will be apparent to those of ordinary skill in the art, along with equivalent variations. In addition, embodiments of the disclosure are not described with reference to any particular programming language. It is appreciated that a variety of programming languages may be used to implement the present teachings as described herein, and any references to specific languages are provided for disclosure of enablement and best mode of embodiments of the disclosure. Embodiments of the disclosure are well suited to a wide variety of computer network systems over numerous topologies. Within this field, the configuration and management of large networks include storage devices and computing devices that are communicatively coupled to dissimilar computing and storage devices over a network, such as the Internet, also referred to as "web" or "world wide web".

Throughout this disclosure and elsewhere, block diagrams and flowchart illustrations depict methods, apparatuses (e.g., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "component", "module," or "system."

While the foregoing drawings and description set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

The functions, systems and methods herein described could be utilized and presented in a multitude of languages. Individual systems may be presented in one or more languages and the language may be changed with ease at any point in the process or methods described above. One of ordinary skill in the art would appreciate that there are numerous languages the system could be provided in, and embodiments of the present disclosure are contemplated for use with any language.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

It will be apparent to those skilled in the art that various modifications and variations can be made to the disclosed system and method. Other embodiments will be apparent to those skilled in the art from consideration of the specification and practice of the disclosed method and apparatus. It is intended that the specification and examples be considered as exemplary only, with a true scope being indicated by the following claims.

What is claimed is:

1. An analog device control system, comprising:
   an analog device control module, comprising computer-executable code stored in non-volatile memory;
   a processor; and
   an analog device;
   wherein the analog device control module, the processor, and the analog device are operably connected and configured to:
   use the analog device to receive an analog audio signal in the form of a live performance;
   digitally control the analog device using the analog device control module; and
   vary the analog audio signal using the analog device control module;
   wherein varying the analog signal is based on digitally controlling the analog device using the analog device control module,
   wherein said varying of the analog audio signal comprises digitally changing parameter values of the analog audio signal in substantially real time, wherein said changed parameter values are stored in said memory for later retrieval and application to a subsequent performance.

2. The analog device control system of claim 1, wherein digitally controlling the analog device includes manipulating an effect plug-in using a user interface.

3. The analog device control system of claim 1, wherein digitally controlling the analog device includes changing settings of the analog device at a plurality of time points.

4. The analog device control system of claim 3, wherein the analog device control module stores data of each setting change value at each of the plurality of time points.

5. The analog device control system of claim 4, wherein the analog device control module controls the analog device to vary the analog signal based on the stored data.

6. The analog device control system of claim 3, wherein the data of each setting change value is stored as a function of time.

7. The analog device control system of claim 3, wherein the analog device control module stores the data during a first time period.

8. The analog device control system of claim 7, wherein the analog device control module controls the analog device to vary the analog signal based on the stored data during a second time period following the first time period.

9. The analog device control system of claim 1, wherein digitally controlling the analog device includes using machine learning processes.

10. A method, comprising:
 receiving an analog audio signal in the form of a live performance using an analog device;
 using an adjustment part to digitally make a first setting change value of the analog device in substantially real time to vary the analog audio signal at a first time point;
 storing the first setting change value and its corresponding first time point;
 using the adjustment part to digitally make a second setting change value of the analog device in substantially real time to vary the analog audio signal at a second time point; and
 storing the second setting change value and its corresponding second time point;
 retrieving said first and second setting changes and applying said setting changes in accordance with said time points to an analog audio signal in the form of a subsequent performance.

11. The method of claim 10, wherein the adjustment part is a mechanical component disposed on the analog device.

12. The method of claim 10, wherein the adjustment part is a knob disposed on the analog device.

13. The method of claim 10, further comprising controlling the analog device to vary the analog audio signal based on the first data and the second data.

14. The method of claim 10, wherein the first data and the second data are stored during a first time period.

15. The method of claim 14, further comprising controlling the analog device to vary the analog audio signal based on the first data and the second data during a second time period following the first time period.

16. An analog device control system, comprising:
 an analog device control module, comprising computer-executable code stored in non-volatile memory;
 a processor;
 an effect plug-in included in the analog device control module;
 a user interface; and
 an analog device;
 wherein the analog device control module, the processor, the effect plug-in, the user interface and the analog device are operably coupled and configured to:
  use the analog device to receive an analog audio signal in the forma of a live performance;
  digitally control the analog device using the analog device control module; and
  vary the analog audio signal using the analog device control module;
 wherein varying the analog audio signal is based on digitally controlling the analog device using the analog device control module; and
 wherein digitally controlling the analog device includes manipulating the effect plug-in using the user interface,
 wherein said varying of the analog audio signal comprises digitally changing parameter values of the analog audio signal in substantially real time, wherein said changed parameter values are stored in said memory for later retrieval and application to a subsequent performance.

17. The analog device control system of claim 16, wherein the effect plug-in is an audio effect plug-in having an interface that is displayed on the user interface.

18. The analog device control system of claim 16, wherein digitally controlling the analog device includes changing settings of the analog device at a plurality of time points.

19. The analog device control system of claim 18, wherein the analog device control module stores data of each setting change value at each of the plurality of time points.

20. The analog device control system of claim 19, wherein the analog device control module controls the analog device to vary the analog audio signal based on the stored data.

21. The analog device control system of claim 1, wherein the live performance is at least one of a recording studio performance, television performance, movie performance, radio performance, or musical performance.

* * * * *